United States Patent
Nishiyama

(10) Patent No.: US 7,068,114 B2
(45) Date of Patent: Jun. 27, 2006

(54) CONSTANT CURRENT CIRCUIT USED FOR RING OSCILLATOR AND CHARGE PUMP CIRCUIT

(75) Inventor: Yoshinobu Nishiyama, Guma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/912,709

(22) Filed: Aug. 5, 2004

(65) Prior Publication Data

US 2005/0046498 A1    Mar. 3, 2005

(30) Foreign Application Priority Data

Aug. 7, 2003 (JP) ............................. 2003-289312

(51) Int. Cl.
*H03B 27/00* (2006.01)
(52) U.S. Cl. .................. 331/57; 331/185; 331/175; 327/536
(58) Field of Classification Search ............... 331/185, 331/175, 57; 327/536
See application file for complete search history.

(56) References Cited

U.S. PATENT DOCUMENTS 6,809,603 B1 * 10/2004 Ho ............................ 331/57

FOREIGN PATENT DOCUMENTS

JP       7-298607       11/1995

* cited by examiner

*Primary Examiner*—Arnold Kinkead
(74) *Attorney, Agent, or Firm*—Hogan & Hartson LLP

(57) ABSTRACT

A first current flowing through a first resistance is determined by a series connection between a first resistance and a transistor which is short circuited between the gate and the drain. Further, a second current flowing through a second resistance is determined by a series connection between a resistance and two or more transistors each having a short circuit between the gate and the drain. By drawing the second current from below the first resistance, a current fed through a reference transistor is established to be equal to (the first current)–(the second current). The second current starts flowing when the source voltage is equal to or greater than the summed values of the voltage drops between the gate and the source of the two or more transistors. Therefore, the second current becomes zero when the source voltage is lower than a predetermined value. In this manner, a sufficient amount of current is output when the source voltage is relatively low, and the constant current output when the source voltage is high can be controlled so as not to be unnecessarily large.

3 Claims, 4 Drawing Sheets

CONSTANT CURRENT CIRCUIT USED FOR RING OSCILLATOR AND CHARGE PUMP CIRCUIT

CROSS-REFERENCE TO RELATED APPLICATION(S)

The entire disclosure of Japanese Patent Application No. 2003-289312 including specification, claims, drawings and abstract is incorporated herein by reference in its entirety.

BACKGROUND OF THE INVENTION

1. Field of the Invention

This invention relates to a ring oscillator used for a charge pump circuit or the like, and relates to a constant current circuit suitable for use as a current generator of an inverter in the ring oscillator.

2. Description of the Related Art

A charge pump for providing voltage boost by means of control of charging a capacitor has conventionally been known. Such a charge pump can be used for generating a high voltage necessary for clearing a memory such as a nonvolatile memory.

In a charge pump using CMOS as shown in FIG. 1, for example, a source voltage VDD is supplied to a source of an N channel transistor (MOS) 10. A drain of the N channel transistor 10 is connected to one terminal of a shift capacitor 12 which is supplied with a pulse voltage on the other terminal. The drain of the N channel transistor 10 is also connected to a drain of a P channel transistor (MOS) 14. A source of the P channel transistor 14 is connected to one terminal of a capacitor 16 for holding a voltage in addition to an output terminal 18. The other terminal of the capacitor 16 is connected to ground.

In the charge pump, the same pulse signal is supplied to of the gates of both the transistor 10 and the transistor 16.

In this type of circuit, a voltage VDD is set in the shift capacitor 12 while the transistor 10 is turned on and the transistor 14 is turned off. By shifting the voltage of the shift capacitor 12 by, for example, the voltage VDD using a pulse voltage of VDD while the transistor 10 is turned off and the PMOS 14 is turned on, a voltage of the capacitor 16 is set to the voltage of 2VDD which will be output.

In such a charge pump, current is controlled by measuring an output voltage and adjusting, for example, a frequency of a clock to be supplied according to a measured value of the output voltage.

As the charge pump, one example is disclosed in Japanese Patent Laid-Open Publication No. Hei 7-298607.

However, in the charge pump (a voltage booster circuit) for generating a high voltage necessary for rewriting to a nonvolatile memory or the like, a consumed current and an output current increase almost proportionately with a value of the source voltage VDD as long as an operation clock for the charge pump remains constant regardless of changes in source voltage. Because the output current of the charge pump is proportional to the source voltage, the charge pump is designed to achieve a sufficient amount of the output current for rewriting being secured with a guaranteed minimum source voltage. As a result, regardless of the fact that the amount of current necessary for rewriting to a nonvolatile memory does not change sharply in a region where the source voltage is high, an unnecessarily large amount of current is output when the source voltage is high. At that time, a large amount of source current is thus consumed in vain.

SUMMARY OF THE INVENTION

According to the present invention, a characteristic that a steep slope of change with respect to a source voltage on a lower voltage side becomes a small slope on a higher voltage side is imparted to a constant current source of each inverter constituting a ring oscillator. With this characteristic, a constant current corresponding to the source voltage can be increased at a relatively low voltage to make a charge pump circuit operable at a relatively low source voltage. On the other hand, at the higher voltage side, a rise in the source voltage brings about small change in the amount of current in the constant current source. As long as the amount of current in the constant current source is constant, a frequency at which the ring oscillator oscillates varies inversely with the source voltage. Accordingly, the change in current output from a voltage booster circuit due to the rise of the source voltage becomes small, which prevents a large amount of current being output in vain when the source voltage is high, and, in turn, makes it possible to avoid unnecessary consumption of a large amount of source current.

DESCRIPTION OF THE PREFERRED EMBODIMENT

Referring to drawings, an example structure according to an embodiment of this invention will be described.

Figure 1:
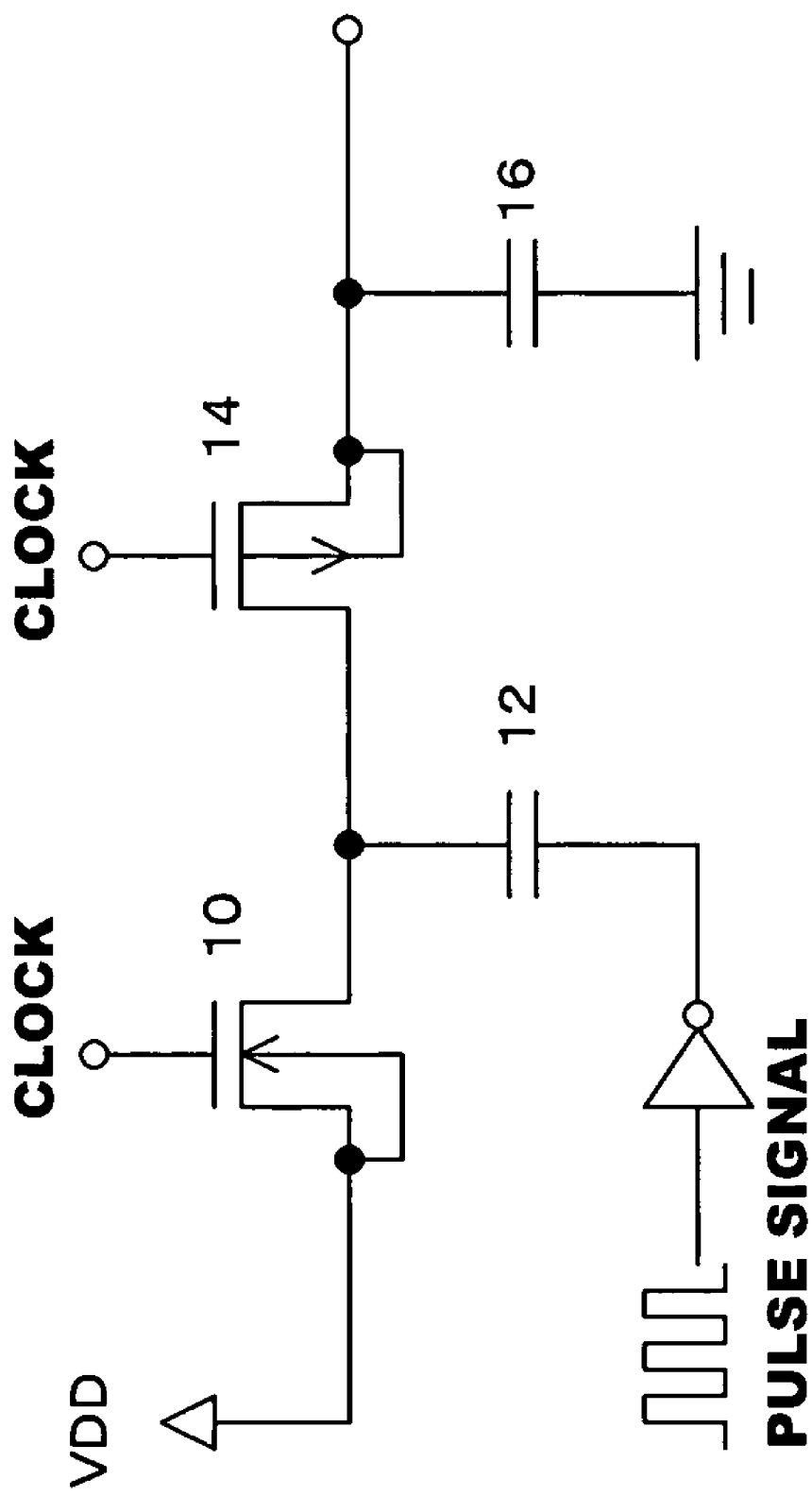
FIG. 1 shows the structure of a charge pump circuit.
Figure 2:
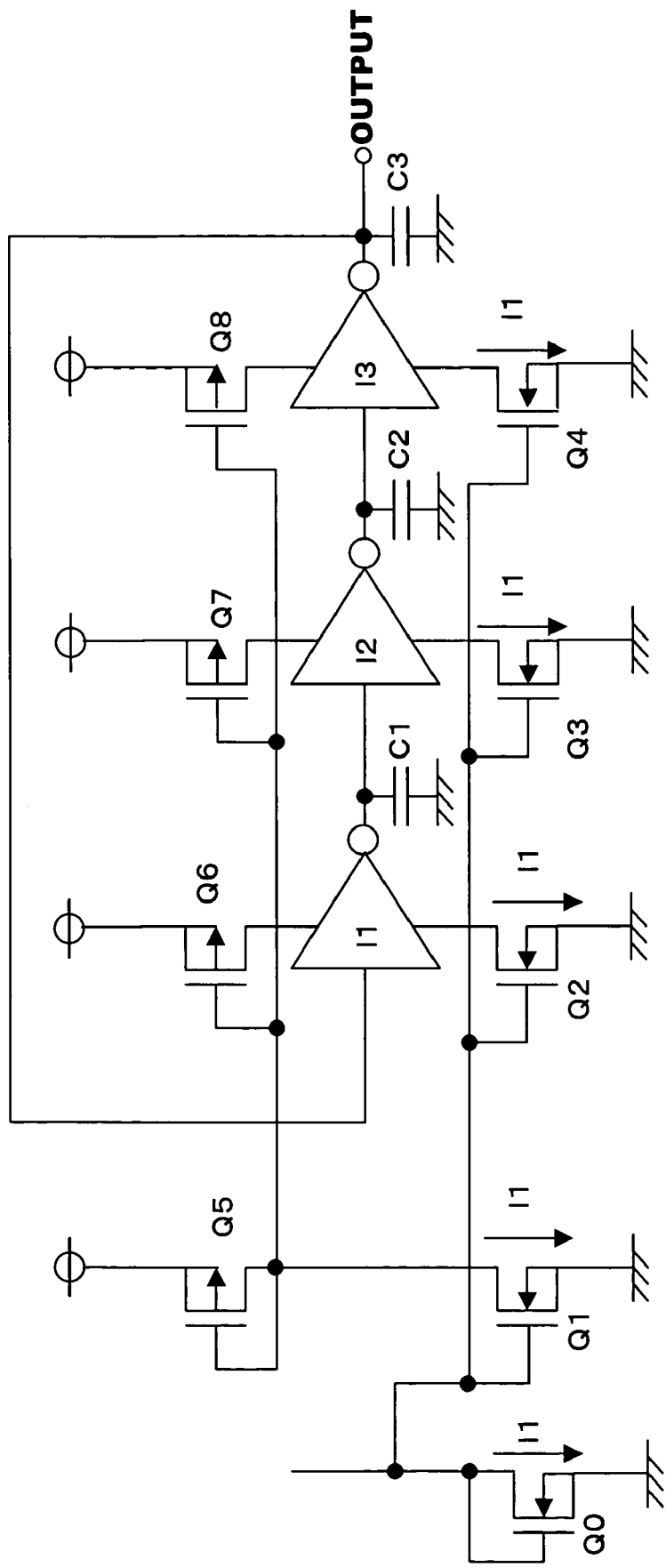
FIG. 2 shows the structure of a ring oscillator.

FIG. 2 shows the structure of a ring oscillator. In this structure, three inverters IV1, IV2, and IV3 are connected in series shaped like a ring. Each output of the inverters IV1, IV2, and IV3 is individually connected to one of capacitors C1, C2, and C3 which are connected to ground at the other terminals. A clock is output from the output of the inverter C3 and supplied to a charge pump circuit.

A gate of an N channel transistor (NMOS) Q0 with a short circuit between the gate and the drain in which a predetermined set current I1 flows is connected to gates of N channel transistors Q1, Q2, Q3, and Q4 whose sources are connected to ground. The current I1 runs through all the transistors Q0 to Q4. The transistors Q2, Q3, and Q4 determine operation currents for the inverters IV1, IV2, and IV3. A drain of the transistor Q1 is connected to a drain of a P channel transistor Q5 having a short circuit between the gate and the drain thereof, and a source of the transistor Q5 is connected to a power source. In this configuration, the current I1 flows through the transistor Q5. Further, a gate of the transistor Q5 is connected to gates of P channel transistors (PMOS) Q6, Q7, and Q8 whose sources are connected to power sources so as to supply currents to the inverters IV1, IV2, and IV3.

With such a circuit, a predetermined clock can be obtained, and the obtained clock is affected by the set current I1 running through the transistor Q0.

Figure 3:
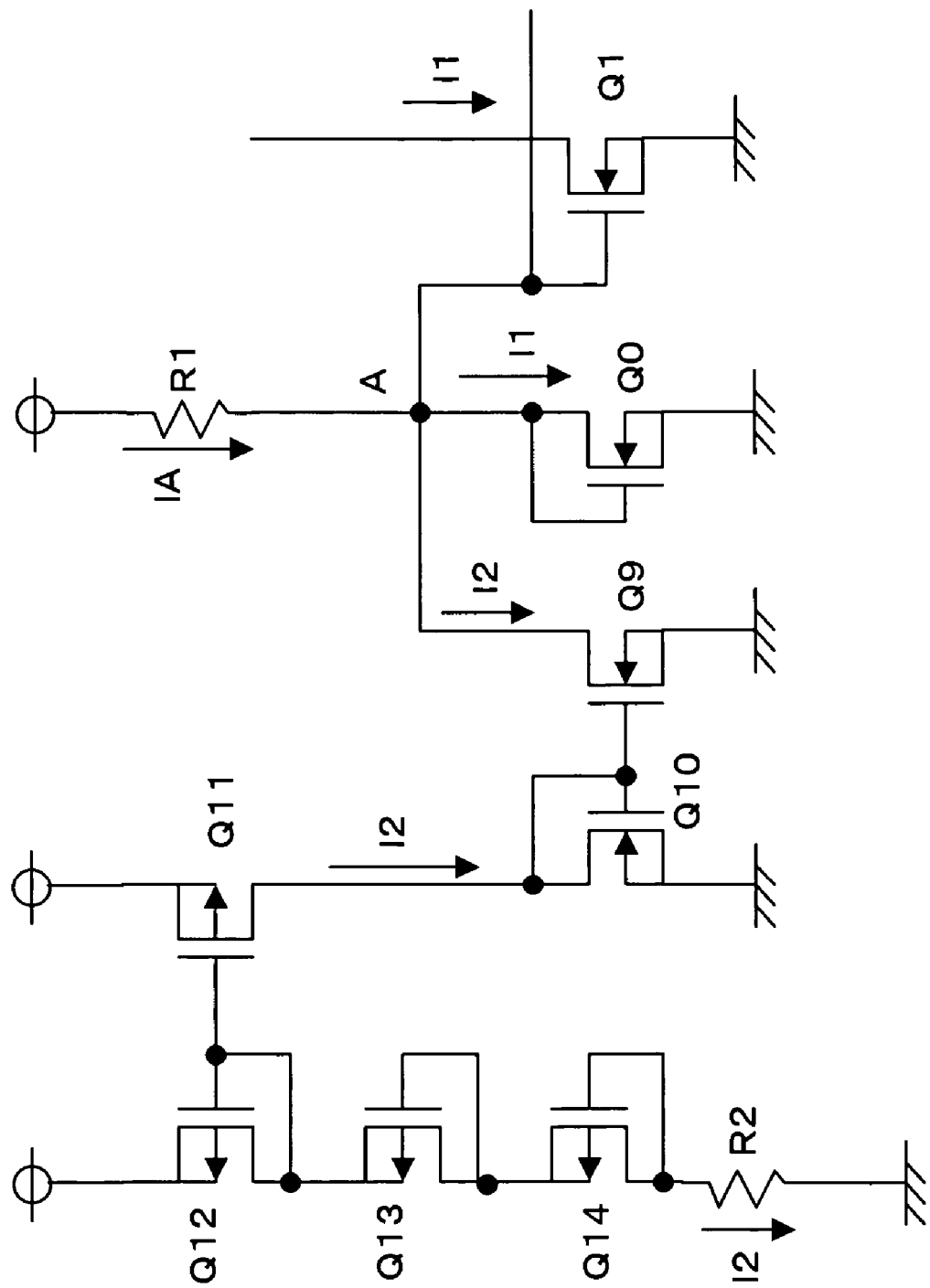
FIG. 3 shows the structure of a constant current circuit.

FIG. 3 shows a circuit which generates the set current I1. In the circuit, the drain of the transistor Q0 is connected via a resistance R1 to a power source. Assuming a voltage of the source voltage as VDD, a current IA is expressed as IA= (VDD−Vt)/R1 where Vt represents a value of voltage drop (a voltage between the gate and the source of the transistor Q0), and R1 represents a resistance value of the resistance R1.

In this circuit, a junction point between the resistance R1 and the transistor Q0 is connected to a drain of an N channel transistor Q9 which is connected to ground at the other terminal. Accordingly, when a current I2 runs through the transistor Q9, the current I2 passes through the resistance R1 but does not flow into the transistor Q0.

A gate of the transistor Q9 is connected to a gate of an N channel transistor Q10 which has a source connected to ground (diode-connection) and which is short circuited between the gate and the drain. On the other hand, a drain of the transistor Q10 is connected to a drain of a P channel transistor Q11 whose source is connected to a power source. A gate of the transistor Q11 is connected to a gate of a transistor Q12 which has a source connected to a power source and a short circuit between the gate and the drain, and a drain of the transistor Q12 is connected to ground via two P channel transistors Q13 and Q14, each having a short circuit between the gate and the drain, and via a resistance R2.

Accordingly, a current I2 determined as I2=(VDD−3Vt)/R2 flows through the transistors Q12, Q13, and Q14 and the resistance R2. In the above equation, Vt represents a value of voltage drop (a voltage between the gate and the source) of the transistors Q12, Q13, and Q14, and R2 represents a resistance value of the resistance R2. In this example, because R2 is set to satisfy the following equation: R2=R1·(¾), the current I2 can be expressed as I2=(VDD−3Vt)/R1·(¾). Further, the current I2 will be fed into the transistors Q11, Q10, and Q9. Therefore, taking a current passing through the transistor Q0 as I1, the current I1 can be expressed as I1=IA−I2. It is thus understood that the currents of the inverters IV1, IV2, and IV3 in the ring oscillator are also affected by the current I2.

Figure 4:
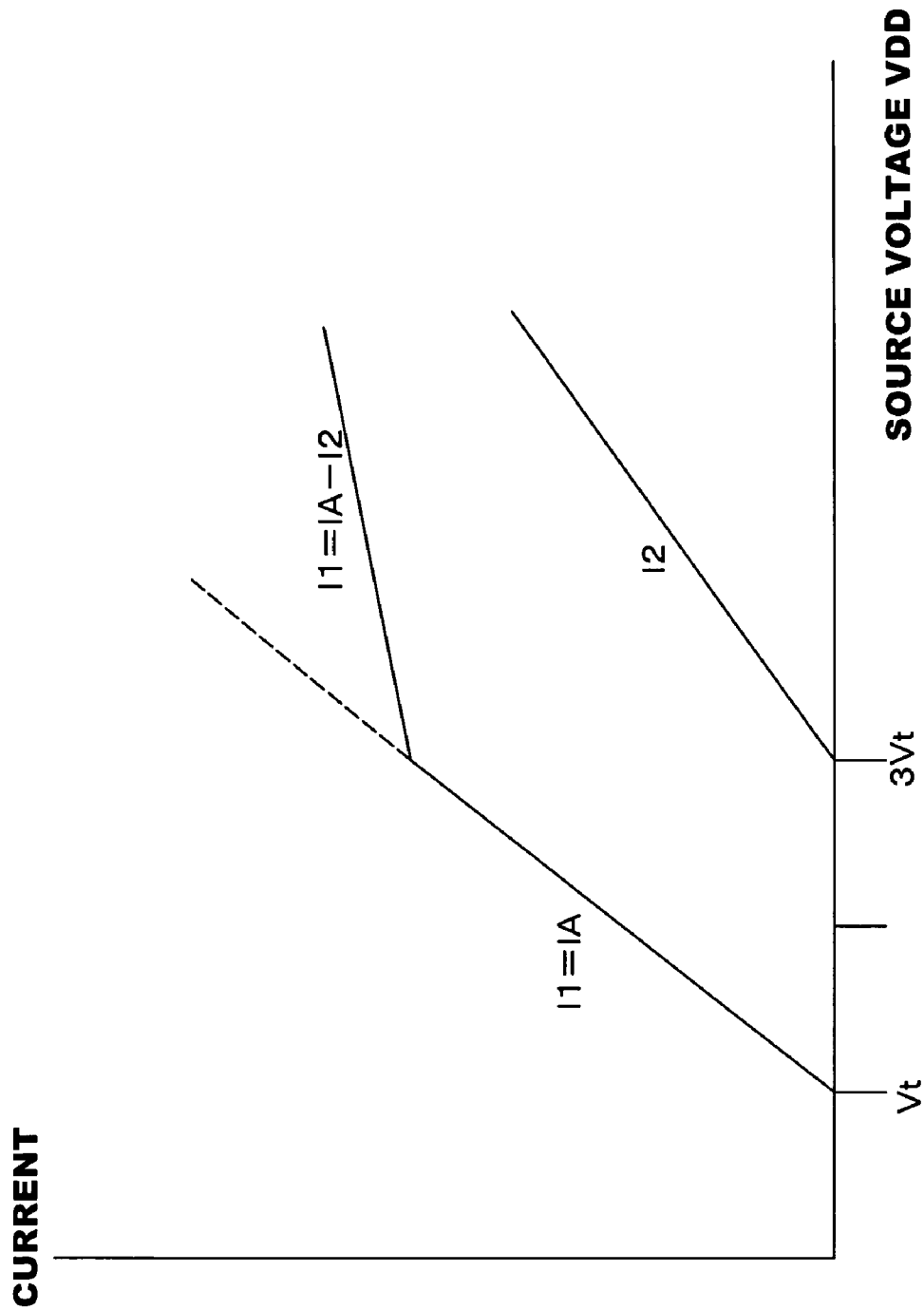
FIG. 4 shows a relationship between a source voltage and a constant current.

Here, a relationship among the source voltage VDD and the currents IA, I1, I2 is shown in FIG. 4. As can be seen from the graph, the current IA occurs when the source voltage is Vt or greater, and the current I2 occurs when the source voltage VDD is 3Vt or greater. Further, the slope with respect to the source voltage VDD differs between the currents IA and I2. Accordingly, the current I1 is expressed as I1=IA=(VDD−Vt)/R1 when the source voltage VDD is within the range of from Vt to 3Vt, and expressed as I1=IA−I2 when the source voltage VDD is 3Vt or greater, which denotes that the slope becomes smaller in a region where the source voltage VDD is 3Vt or greater.

When nodes between the inverters IV1, IV2, and IV3 are charged until transition of outputs of the inverters IV1, IV2, and IV3 takes place, the amount of charge to be supplied is calculated by multiplying a threshold value of the inverter (which is proportional to the source voltage) by capacitance of the node. Therefore, the frequency the ring oscillator oscillates at is inversely proportional to the source voltage as long as a current source is constant. Although the current in the constant current source increases slightly at the higher source voltage in this embodiment, the current may be kept constant at the higher source voltage.

Because the output current per one clock from a voltage booster circuit is substantially proportional to the source voltage, by supplying a clock which varies almost inversely as the source voltage to be generated in the circuit, the output current is kept substantially constant. In this manner, the consumption of a large amount of source current as a result of an unnecessarily large current being output from the voltage booster circuit when the source voltage is high is prevented.

According to this embodiment, when the current source starts up, the slope with respect to the source voltage VDD is great as shown in FIG. 4, and the slope becomes smaller at a later time. Thus, the capability of the charge pump can be maintained sufficiently even when the source voltage is relatively low, whereas power consumption can be suppressed when the source voltage is high, which enables effective operation of the charge pump.

Although the resistance R2 is set to a value equal to that of the resistance R1 and connected to the three transistors in series in the above-described example, the setting value of the resistance may be changed variously and the number of the transistors may also be changed. With this changeability, it becomes possible to realize various characteristics. Further, by additionally providing another circuit similar to the circuit for generating the current I2 and adjusting characteristics of the additional circuit, circuit characteristics as a whole can further be varied in an arbitrary manner.

What is claimed is:

1. A ring oscillator having a plurality of inverters connected in a shape of a ring and generating a clock signal comprising a plurality of separate constant current sources each provided to one of the inverters to supply a constant drive current to the corresponding one of the inverters, and a reference constant current source for feeding a reference constant current which determines current values of the plurality of separate constant current sources, wherein the reference constant current source has a characteristic that a steep slope of change with respect to a source voltage on a lower voltage side becomes a small slope on a higher voltage side, and wherein the reference constant current source comprises:

a first current path configured by a series connection between a resistance and a diode-connected transistor, and placed between a power source and ground, and a second current path configured by a series connection between at least two diode-connected transistors connected in series and a resistance having a resistance value smaller than that of the resistance in the first current path, and placed between a power source and ground, wherein, in the reference constant current source a current of the second current path is drawn from a junction point between the resistance and the transistor in the first current path, and when the source voltage is low and a current flows only in the first current path, the current running through the first current path is fed as the reference constant current, whereas when the source voltage is high and the current flows also in the second current path in addition to the first current path, the current obtained by subtracting the current of the second current path from the current of the first current path is fed as the reference constant current.

2. The ring oscillator according to claim 1, wherein each of the separate constant current sources includes an individual transistor for feeding the constant drive current, the reference constant current source includes a reference transistor for feeding the reference constant current, and the reference transistor and the individual transistors constitute a current mirror in which a constant current flowing through each of the individual transistors is determined by the reference current flowing through the reference transistor.

3. A charge pump circuit which executes a voltage boosting operation using a clock output from a ring oscillator having a plurality of inverters connected in a shape of a ring and generating a clock signal, comprising:

a plurality of separate constant current sources each provided to one of the inverters to supply a constant drive current to the corresponding one of the inverters, and a reference constant current source for feeding a reference constant current which determines current values of the plurality of separate constant current sources, wherein the reference constant current source has a characteristic that a steep slope of change with respect to a source voltage on a lower side becomes a small slope on a higher voltage side.

* * * * *